United States Patent
Yeo et al.

(10) Patent No.: US 11,133,783 B2
(45) Date of Patent: Sep. 28, 2021

(54) POWER AMPLIFIER AND IMPEDANCE ADJUSTMENT CIRCUIT

(71) Applicants: Samsung Electronics Co., Ltd., Gyeonggi-do (KR); Postech Academy-Industry Foundation, Gyeongsangbuk-do (KR)

(72) Inventors: Sung-Ku Yeo, Seoul (KR); Bum-Man Kim, Gyeongsangbuk-do (KR); Yun-Sik Park, Daejeon (KR); Sang-Wook Kwon, Gyeonggi-do (KR); Dong-Gyu Min, Seoul (KR); Sung-Bum Park, Gyeonggi-do (KR)

(73) Assignees: Samsung Electronics Co., Ltd; Postech Academy-Industry Foundation

( * ) Notice: Subject to any disclaimer, the term of this patent is extended or adjusted under 35 U.S.C. 154(b) by 60 days.

(21) Appl. No.: 16/483,171

(22) PCT Filed: Feb. 2, 2018

(86) PCT No.: PCT/KR2018/001445
§ 371 (c)(1),
(2) Date: Aug. 2, 2019

(87) PCT Pub. No.: WO2018/147598
PCT Pub. Date: Aug. 16, 2018

(65) Prior Publication Data
US 2020/0235708 A1    Jul. 23, 2020

(30) Foreign Application Priority Data
Feb. 9, 2017 (KR) .................. 10-2017-0018326

(51) Int. Cl.
*H03F 3/191* (2006.01)
*H03F 1/56* (2006.01)
(Continued)

(52) U.S. Cl.
CPC ............... *H03F 1/56* (2013.01); *H03F 3/195* (2013.01); *H03F 3/1935* (2013.01); *H03F 3/245* (2013.01);
(Continued)

(58) Field of Classification Search
CPC ...................................................... H03F 3/191
(Continued)

(56) References Cited

U.S. PATENT DOCUMENTS 7,714,664 B2 *  5/2010  Kanaya ................ H03F 3/1935
                                                       330/311
7,746,173 B1   6/2010  Tserng et al.
(Continued)

FOREIGN PATENT DOCUMENTS

| KR | 1020130042012 | 4/2013 |
| KR | 1020140096095 | 8/2014 |
| KR | 1020160100797 | 8/2016 |

OTHER PUBLICATIONS

PCT/ISA/210 Search Report issued on PCT/KR2018/001445, pp. 5.
(Continued)

*Primary Examiner* — Henry Choe
(74) *Attorney, Agent, or Firm* — The Farrell Law Firm, P.C.

(57) ABSTRACT

A power amplifier may comprise: an element for amplifying an electrical signal received through an input terminal, and outputting the amplified electrical signal through an output terminal; a first impedance adjustment circuit connected to the input terminal of the element and adjusting impedance with respect to a frequency of a fundamental component at the input terminal; a second impedance adjustment circuit connected to the input terminal of the element and adjusting impedance with respect to a frequency of a multiplied harmonic component at the input terminal; a third imped-
(Continued)

ance adjustment circuit connected to the output terminal of the element and adjusting impedance with respect to the frequency of the fundamental component at the output terminal; a fourth impedance adjustment circuit connected to the output terminal of the element and adjusting impedance with respect to the frequency of the multiplied harmonic component at the output terminal; a first frequency separation circuit which prevents an impedance change by the first impedance adjustment circuit with respect to the frequency of the multiplied harmonic component at the input terminal, and prevents an impedance change by the second impedance adjustment circuit with respect to the frequency of the fundamental component at the input terminal; and a second frequency separation circuit which prevents an impedance change by the third impedance adjustment circuit with respect to the frequency of the multiplied harmonic component at the output terminal, and prevents an impedance change by the fourth impedance adjustment circuit with respect to the frequency of the fundamental component at the output terminal.

12 Claims, 9 Drawing Sheets

(51) Int. Cl.
  *H03F 3/193* (2006.01)
  *H03F 3/195* (2006.01)
  *H03F 3/24* (2006.01)

(52) U.S. Cl.
  CPC .. *H03F 2200/213* (2013.01); *H03F 2200/255* (2013.01); *H03F 2200/423* (2013.01); *H03F 2200/451* (2013.01); *H03F 2200/555* (2013.01)

(58) Field of Classification Search
  USPC .................................................. 330/302, 305
  See application file for complete search history.

(56) References Cited

U.S. PATENT DOCUMENTS

| | | |
|---|---|---|
| 2003/0025487 A1 | 2/2003 | Jian et al. |
| 2006/0145761 A1 | 7/2006 | Pribble et al. |
| 2013/0116017 A1 | 5/2013 | Zhang et al. |
| 2014/0340177 A1* | 11/2014 | Hosoya ..................... H03F 3/60 333/219 |
| 2015/0381140 A1 | 12/2015 | Embar et al. |
| 2016/0241196 A1 | 8/2016 | Lehtola |

OTHER PUBLICATIONS

PCT/ISA/237 Written Opinion issued on PCT/KR2018/001445, pp. 6.

Yunsik Park et al., "A Highly Efficient Power Amplifier at 5.8 GHz Using Independent Harmonic Control", . . . IEEE Microwave and Wireless Components Letters, vol. 27, No. 1, Jan. 2017, Copyright 2016 IEEE, pp. 4.

* cited by examiner freq (5.800GHz to 5.800GHz)

freq (11.60GHz to 11.60GHz)

POWER AMPLIFIER AND IMPEDANCE ADJUSTMENT CIRCUIT

CROSS-REFERENCE TO RELATED APPLICATION(S)

This application is a National Phase Entry of PCT International Application No. PCT/KR2018/001445, which was filed on Feb. 2, 2018, and claims priority to Korean Patent Application No. 10-2017-0018326, which was filed on Feb. 9, 2017, the contents of which are incorporated herein by reference.

BACKGROUND

1. Field

The disclosure relates to a power amplifier and an impedance adjustment circuit.

2. Description of the Related Art

For many people living in the present time, portable digital communication devices have become a necessity. Consumers want to be provided with various and desirable high-quality services anytime and anywhere. Furthermore, with the development of Internet-of-Things (IoT) technology in recent years, various types of sensors, home appliances, and communication devices existing in our daily lives are being networked together. To properly operate various sensors, wireless power transmission systems are required.

Wireless power transmission includes a magnetic induction method, a magnetic resonance method, and an electromagnetic wave method, among which the electromagnetic wave method is more suitable for remote power transmission than the other methods.

In wireless power transmission using the electromagnetic wave method, a wireless power transmitter may transmit electromagnetic waves of a relatively high frequency (e.g., 5.8 GHz). The wireless power transmitter may amplify an electrical signal of a relatively high frequency using a power amplifier and may provide the amplified electrical signal to an antenna array. The antenna array may transmit electromagnetic waves having a relatively high frequency using the amplified electrical signal.

The wireless power transmitter needs to amplify an electrical signal with relatively large output at relatively high efficiency. Accordingly, the power amplifier included in the wireless power transmitter may perform impedance matching at an input terminal and an output terminal.

SUMMARY

Since a conventional power amplifier operates in a nonlinear manner, an amplified electrical signal output from the power amplifier may include a harmonic component. A frequency of a harmonic component may be a relatively high frequency, and thus impedance due to the harmonic component may affect impedance at an input terminal or output terminal of the power amplifier. The conventional power amplifier does not include separate impedance adjustment circuits for a frequency of a fundamental component and a frequency of a harmonic component. Thus, when adjusting impedance for the frequency of the fundamental component, impedance for the frequency of the harmonic component is also changed, making it difficult to perform desired impedance matching. On the contrary, when adjusting impedance for the frequency of the harmonic component, impedance for the frequency of the fundamental component is also changed, making it difficult to perform desired impedance matching.

A power amplifier according to various embodiments may independently adjust impedance for a frequency of a harmonic component and impedance for a frequency of a fundamental component. An impedance adjustment circuit according to various embodiments may independently adjust impedances for a plurality of different frequencies.

A power amplifier according to various embodiments may include: an element configured to amplify an electrical signal received through an input terminal and to output the amplified electrical signal through an output terminal; a first impedance adjustment circuit connected to the input terminal of the element and configured to adjust impedance for a frequency of a fundamental component at the input terminal; a second impedance adjustment circuit connected to the input terminal of the element and configured to adjust impedance for a frequency of a multiplied harmonic component at the input terminal; a third impedance adjustment circuit connected to the output terminal of the element and configured to adjust impedance for the frequency of the fundamental component at the output terminal; a fourth impedance adjustment circuit connected to the output terminal of the element and configured to adjust impedance for the frequency of the multiplied harmonic component at the output terminal; a first frequency separation circuit configured to prevent a change of the impedance for the frequency of the multiplied harmonic component at the input terminal by the first impedance adjustment circuit and to prevent a change of the impedance for the frequency of the fundamental component at the input terminal by the second impedance adjustment circuit; and a second frequency separation circuit configured to prevent a change of the impedance for the frequency of the multiplied harmonic component at the output terminal by the third impedance adjustment circuit and to prevent a change of the impedance for the frequency of the fundamental component at the output terminal by the fourth impedance adjustment circuit.

An impedance adjustment circuit performing impedance matching of an external element according to various embodiments may include: a connection node connected to the external element; a first impedance adjustment circuit configured to adjust impedance for a first frequency; a second impedance adjustment circuit configured to adjust impedance for a second frequency; and a frequency separation circuit configured to prevent a change of the impedance for the second frequency at the connection node by the first impedance adjustment circuit and to prevent a change of the impedance for the first frequency at the connection node by the second impedance adjustment circuit.

According to various embodiments, there may be provided a power amplifier capable of independently adjusting impedance for a frequency of a harmonic component and impedance for a frequency of a fundamental component. In the case where the power amplifier according to various embodiments adjusts impedance for impedance matching at an input terminal or an output terminal, the impedance for the frequency of the fundamental component may not be changed when adjusting the impedance for the frequency of the harmonic component, while the impedance for the frequency of the harmonic component may not be changed when adjusting the impedance for the frequency of the fundamental component. Accordingly, the power amplifier can easily adjust impedance to a desired value. In addition, there may be provided an impedance adjustment circuit

DETAILED DESCRIPTION

Figure 1:
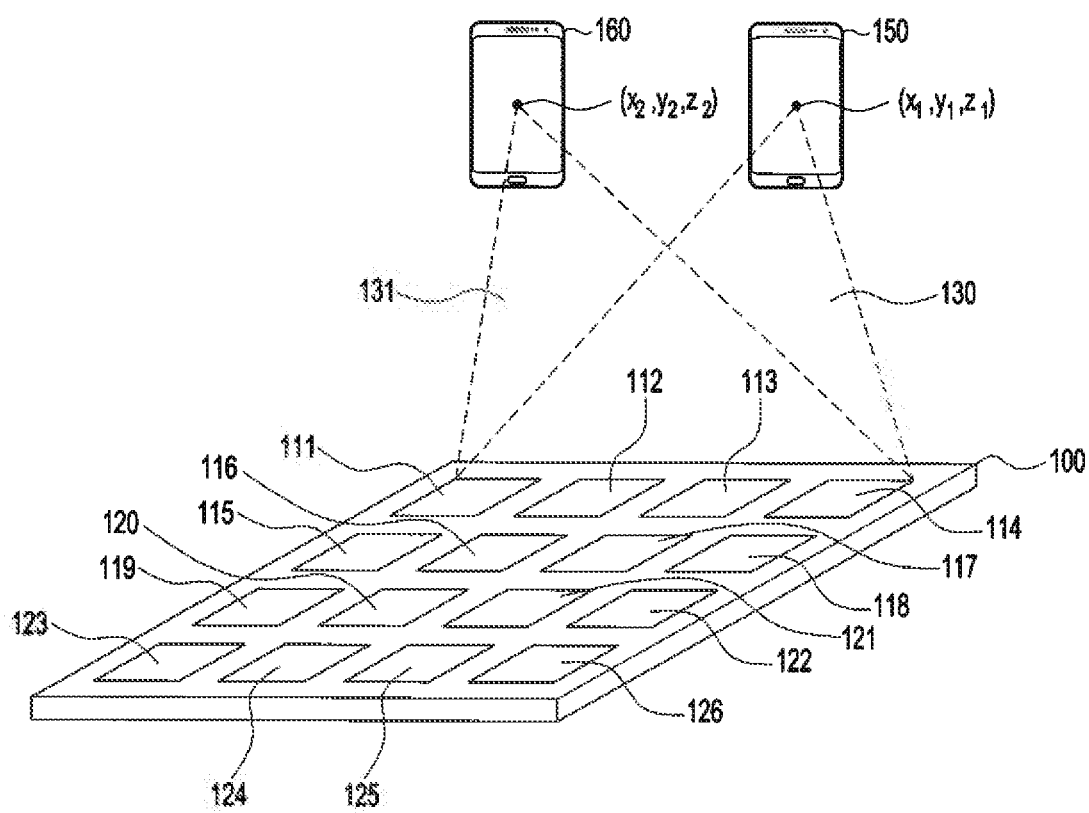
FIG. 1 is a conceptual diagram illustrating a wireless power transmission system according to various embodiments of the disclosure.

Hereinafter, various embodiments of the disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. As used herein, the expression "A or B" or "at least one of A and/or B" may include all possible combinations of items enumerated together. The expression "a first", "a second", "the first", or "the second" may modify various components regardless of the order and/or the importance, and is used merely to distinguish one element from any other element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a pair of glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the wireless power transmitter or the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a media box, a game console, an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Device, an electronic device for a ship (e.g., a navigation device for a ship and a gyrocompass), avionics, security devices, an automotive head unit, a robot for home or industry, an automatic teller's machine (ATM) in banks, point of sales (POS) in a shop, or interne device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). According to various embodiments, a wireless power transmitter or an electronic device may be flexible, or may be a combination of two or more of the above described various devices. The wireless power transmitter or an electronic device according to various embodiments of the disclosure may not be limited to the above described devices. In the disclosure, the term "user" may indicate a person who uses an electronic device or a device (e.g., an artificial intelligence electronic device) that uses a wireless power transmitter or an electronic device.

FIG. 1 is a conceptual diagram illustrating a wireless power transmission system according to various embodiments of the disclosure.

A wireless power transmitter 100 may wirelessly transmit power to at least one electronic device 150 or 160. In various embodiments of the disclosure, the wireless power transmitter 100 may include a plurality of patch antennas 111 to 126. The patch antennas 111 to 126 are not limited as long as the individual patch antennas are capable of generating RF waves. At least one of the amplitude and phase of RF waves generated by the patch antennas 111 to 126 may be adjusted by the wireless power transmitter 100. For convenience of explanation, RF waves generated by the respective patch antennas 111 to 126 are referred to as sub-RF waves.

In various embodiments of the disclosure, the wireless power transmitter 100 may adjust at least one of the amplitude and phase of each of sub-RF waves generated by the patch antennas 111 to 126. The sub-RF waves may act as interference with each other. For example, the sub-RF waves may act as constructive interference with each other at one point, while the sub-RF waves may act as destructive interference with each other at another point. The wireless power transmitter 100 according to various embodiments of the disclosure may adjust at least one of the amplitude and phase of each of the sub-RF waves generated by the patch antennas 111 to 126 so that the sub-RF waves may act as constructive interference with each other at a first point (x1, y1, z1).

For example, the wireless power transmitter 100 may determine that an electronic device 150 is disposed at the first point (x1, y1, z1). Here, the position of the electronic device 150 may be, for example, a position where a power receiving antenna of the electronic device 150 is located. A configuration for the wireless power transmitter 100 to determine the position of the electronic device 150 will be described in more detail below. To enable the electronic device 150 to wirelessly receive power with high transmission efficiency, the sub-RF waves need to act as constructive interference at the first point (x1, y1, z1). Accordingly, the wireless power transmitter 100 may control the patch antennas 111 to 126 so that the sub-RF waves act as constructive interference with each other at the first point (x1, y1, z1). Here, controlling the patch antennas 111 to 126 means controlling the strength of a signal input to the patch antennas 111 to 126 or controlling the phase (or delay) of a signal input to the patch antennas 111 to 126. Beamforming, which is a technique for controlling RF waves to act as constructive interference at a particular point, would be easily understood by those skilled in the art. In addition, it would be easily understood by those skilled in the art that there is no limitation on the type of beamforming used for the disclosure. For example, various beamforming methods, such as those disclosed in US patent application publication number 2016/0099611, US patent application publication number 2016/0099755, and US patent application publication number 2016/0100124, may be used. The form of an RF wave formed by beamforming may also be referred to as pockets of energy.

Thus, an RF wave 130 formed by sub-RF waves may have the maximum amplitude at the first point (x1, y1, z1), and thus the electronic device 150 may receive wireless power with high efficiency. Meanwhile, the wireless power transmitter 100 may detect that an electronic device 160 is disposed at a second point (x2, y2, z2). The wireless power transmitter 100 may control the patch antennas 111 to 126 such that the sub-RF waves may act as constructive interference at the second point (x2, y2, z2) to charge the electronic device 160. Thus, an RF wave 131 formed by sub-RF waves may have the maximum amplitude at the second point (x2, y2, z2), and thus the electronic device 160 may receive wireless power with high transmission efficiency.

Specifically, the electronic device 150 may be disposed relatively on the right side. In this case, the wireless power transmitter 100 may apply a relatively greater delay to sub-RF waves formed by relatively right-side patch antennas (e.g., 114, 118, 122, and 126). That is, sub-RF waves may be generated from the relatively right-side patch antennas (e.g., 114, 118, 122, and 126) after a predetermined period of time from when sub-RF waves are generated by relatively left-side patch antennas (e.g., 111, 115, 119, and 123). Accordingly, the sub-RF waves may meet at the same time at a relatively right-side point, and thus the sub-RF waves may generate constructive interference at the relatively right-side point. When beamforming is performed relatively to a center point, the wireless power transmitter 100 may apply substantially the same delay to the left-side patch antennas (e.g., 111, 115, 119, and 123) and the right-side patch antennas (e.g., 114, 118, 122, and 126). Also, when beamforming is performed to a relatively left-side point, the wireless power transmitter 100 may apply a greater delay to the left-side patch antennas (e.g., 111, 115, 119, and 123) than the right-side patch antennas (e.g., 114, 118, 122, and 126). In another embodiment, the wireless power transmitter 100 may enable all the patch antennas 111 to 126 to generate sub-RF waves substantially at the same time and may perform beamforming by adjusting a phase corresponding to a delay illustrated above.

As discussed above, the wireless power transmitter 100 may determine the position of the electronic devices 150 and 160 and may enable sub-RF waves to act as constructive interference at the determined position, thereby performing wireless charging with high transmission efficiency.

Figure 2:
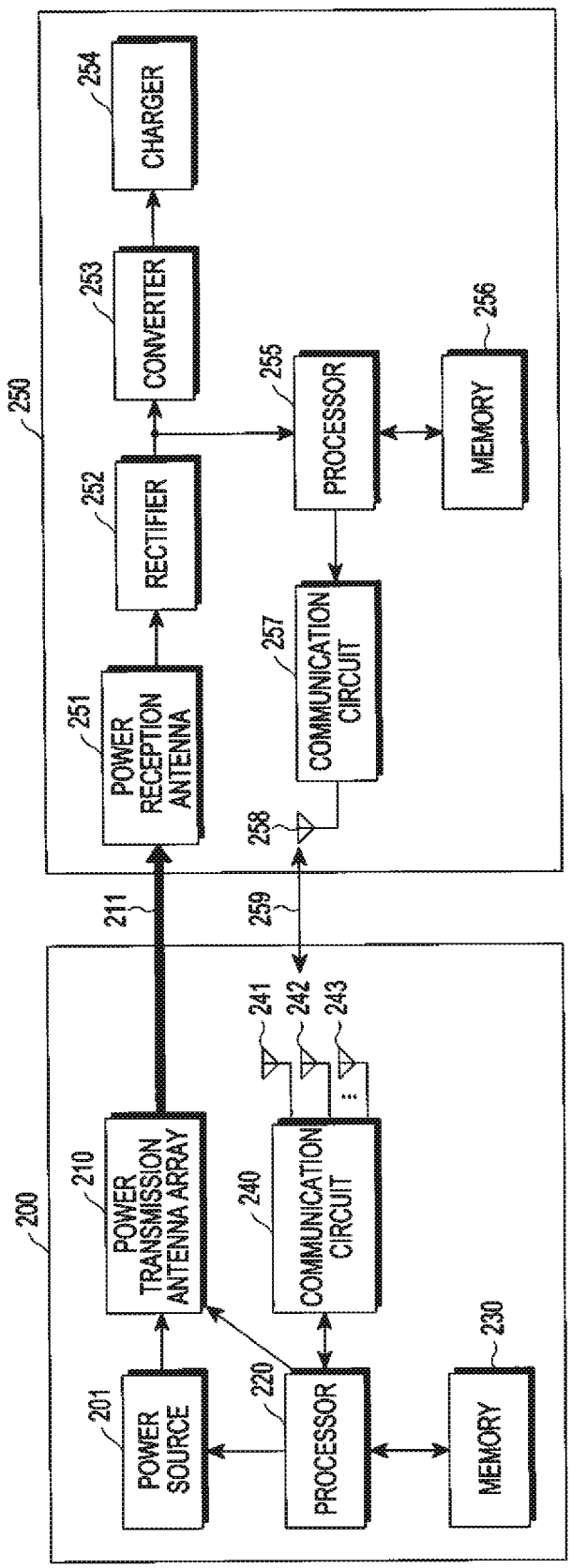
FIG. 2 is a block diagram illustrating a wireless power transmitter according to various embodiments of the disclosure.

FIG. 2 is a block diagram illustrating a wireless power transmitter according to various embodiments of the disclosure.

The wireless power transmitter 200 may include a power source 201, a power transmission antenna array 210, a processor 220, a memory 230, a communication circuit 240, and communication antennas 241 to 243. An electronic device 250 is not limited as long as the electronic device can wirelessly receive power and may include a power reception antenna 251, a rectifier 252, a converter 253, a charger 254, a processor 255, a memory 256, a communication circuit 257, and a communication antenna 258.

The power source 201 may provide power for transmission to the power transmission antenna array 210. The power source 201 may provide, for example, DC power, in which case the wireless power transmitter 200 may further include an inverter (not shown) that converts DC power into AC power and transmits the AC power to the power transmission antenna array 210. In another embodiment, the power source 201 may provide AC power to the power transmission antenna array 210. A power amplifier to amplify power from the power source 201 may be further disposed between the power source 201 and the power transmission antenna array 210, which will be described in detail with reference to FIG. 3. The power amplifier may amplify power input from a power source 301 and may transmit the power to a power transmission antenna array 310. Alternatively, the power transmission antenna array 310 may be configured to include a power amplifier. The power amplifier may perform input-terminal impedance matching and output-terminal impedance matching. Accordingly, for an impedance change due to the movement of the electronic device 250 or a change of surroundings, the power amplifier may perform at least one of input-terminal impedance matching and output-terminal impedance matching in order to achieve maximum efficiency or maximum output.

The power transmission antenna array 210 may include a plurality of patch antennas. For example, as shown in FIG. 1, a plurality of patch antennas may be included in the power transmission antenna array 210. There is no limitation on the number or arrangement of patch antennas. The power transmission antenna array 210 may form an RF wave using power supplied from the power source 201. The power transmission antenna array 210 may form an RF wave in a particular direction under the control of the processor 220. Here, forming an RF wave in a particular direction may mean controlling at least one of the amplitude and phase of sub-RF waves so that the sub-RF waves cause constructive interference at one point in the particular direction. For example, the processor 220 may control individual phase shifters connected to the power transmission antenna array 210, which will be described in detail with reference to FIG. 3. The power transmission antenna array 210 is for power transmission and may also be referred to as a power transmission antenna.

The processor 220 may determine a direction in which the electronic device 250 is positioned and may determine an RF wave formation direction on the basis of the determined direction. That is, the processor 220 may control the patch antennas of the power transmission antenna array 210, which generate sub-RF waves, so that the sub-RF waves cause constructive interference at one point in the determined direction. For example, the processor 220 may control the patch antennas or a control device connected to the patch antennas, thereby controlling at least one of the amplitude and phase of the sub-RF waves generated from the respective patch antennas.

The processor 220 may determine the direction in which the electronic device 250 is positioned using a communication signal received from the communication antennas 241 to 243. That is, the processor 220 may control at least one of the amplitude and phase of the sub-RF waves generated from the respective patch antennas using the communication signal received from the communication antennas 241 to 243. Although three communication antennas 241 to 243 are shown it is merely for illustration as the number of communication antennas is not limited. In one embodiment, at least three communication antennas 241 to 243 may be disposed, which may be for determining θ and φ values in three-dimensional directions, for example, in a spherical coordinate system. Specifically, the communication antenna 258 of the electronic device 250 may transmit a communication signal 259. In various embodiments of the disclosure, the communication signal 259 may include identification information about the electronic device 250 and may include information required for wireless charging. Accordingly, the wireless power transmitter 200 may determine the direction of the electronic device 250 using the communication signal for wireless charging without adding any separate hardware. The communication antennas 241 to 243 may receive the communication signal 259 at different times.

The electronic device 250 may generate a communication signal, which may proceed, for example, as a spherical wave in a space. Accordingly, the time at which a first communication antenna 241 receives the communication signal, the time at which a second communication antenna 242 receives the communication signal, and the time at which a third communication antenna 243 receives the communication signal are different. For example, the first communication antenna 241, which is closest to a point where the communication signal is generated, may receive the communication signal first, the second communication antenna 242 may then receive the communication signal, and the third communication antenna 243 may finally receive the communication signal. When the communication signal has a directional waveform, the times at which the respective communication antennas 241, 242, and 243 receive the communication signal may also be different. In various embodiments of the disclosure, the wireless power transmitter 200 may include three or more communication antennas, which is for determining the reception direction of a communication signal in three dimensions.

The processor 220 of the wireless power transmitter 200 may determine the direction of the electronic device 250 relative to the wireless power transmitter 200 using the times (e.g., t1, t2, and t3) at which the communication antennas 241, 242, and 243 receive the communication signal. For example, the processor 220 may determine the direction of the electronic device 250 relative to the wireless power transmitter 200 using time difference information of t1–t2, t2–t3, and t3–t1. Specifically, as t1–t2 approaches zero, the electronic device 250 may be determined to be disposed on a line perpendicularly passing through the center of a segment connecting the communication antenna 241 and the communication antenna 242. Further, as t1–t2 has a relatively larger positive value, the electronic device 250 may be determined to be closer to the communication antenna 242. In addition, as t1–t2 has a relatively smaller negative value, the electronic device 250 may be determined to be closer to the communication antenna 241. The wireless power transmitter 200 may determine the three-dimensional direction of the electronic device 250 relative to the wireless power transmitter 200 considering not only t1–t2 but also t2–t3 and t3–t1. The processor 220 may determine the relative direction of the electronic device 250 using, for example, a program or algorithm for determining a direction stored in the memory 230. According to another embodiment, the processor 220 may determine the relative direction of the electronic device 250 using, for example, a look-up table including the difference between the reception times of communication antennas and the direction of an electronic device stored in the memory 230. The wireless power transmitter 200 (or the processor 220) may determine the relative direction of the electronic device 250 in a variety of manners. For example, the wireless power transmitter 200 may determine the relative direction of the electronic device 250 using various methods, such as time difference of arrival (TDOA) or frequency difference of arrival (FDOA), and there is no limitation on the type of a program or algorithm for determining the direction of a received signal.

According to still another embodiment, the electronic device 250 may determine the relative direction of the electronic device 250 on the basis of the phase of a received communication signal. The distances between the communication antenna 258 of the electronic device 250 and the respective communication antennas 241, 242, and 243 of the wireless power transmitter 200 may be different. Accordingly, the phase of the communication signal generated from the communication antenna 258 may vary when each of the communication antennas 241, 242, and 243 receives the communication signal. The processor 220 may determine the direction of the electronic device 250 on the basis of a difference in the phase of the communication signal in each of the communication antennas 241, 242, and 243.

The processor 220 may control the power transmission antenna array 210 on the basis of the direction of the electronic device 250, thereby forming an RF wave in the direction of the electronic device 250. The processor 220 may identify the electronic device 250 using information in the communication signal 259. The communication signal 259 may include a unique identifier or a unique address of the electronic device. The communication circuit 240 may process the communication signal 259 to provide the information to the processor 220. The communication circuit 240 and the communication antennas 241, 242, and 243 may be manufactured on the basis of various communication modes, such as Wireless Fidelity (Wi-Fi), Bluetooth, ZigBee, and Bluetooth Low Energy (BLE), and there is no limitation on the type of communication mode. The communication signal 259 may include rated power information about the electronic device 250, and the processor 220 may determine whether to charge the electronic device 250 on the basis of at least one of the unique identifier, the unique address, and the rated power information. The processor 220 may include one or more of a central processing unit (CPU), an application processor (AP), or a communication processor (CP) and may be configured as a micro-controller unit or a minicomputer.

The communication signal 259 may also be used by the wireless power transmitter 200 in a process of identifying the electronic device 250, in a process of allowing power transmission to the electronic device 250, in a process of requesting reception power-related information from the electronic device 250, in a process of receiving reception power-related information from the electronic device 250, and the like. That is, the communication signal 259 may be used in a registration, instruction, or request process between the wireless power transmitter 200 and the electronic device 250.

The processor 220 may control the power transmission antenna array 210 to form an RF wave 211 in the determined direction of the electronic device 250. The processor 220 may also determine the distance to the electronic device 250 using another communication signal which forms an RF wave for detection and is then received as feedback.

Accordingly, the processor 220 may determine both the direction of the electronic device 250 and the distance to the electronic device 250 and may ultimately determine the position of the electronic device 250. The processor 220 may control the patch antennas such that sub-RF waves generated by the patch antennas act as constructive interference at the position of the electronic device 250. Accordingly, the RF wave 211 may be transmitted to the power reception antenna 251 at relatively high transmission efficiency. The power reception antenna 251 may be any antenna capable of receiving an RF wave, without being limited. In addition, the power reception antenna 251 may also be configured as an array including a plurality of antennas. AC power received by the power reception antenna 251 may be rectified into DC power by the rectifier 252. The converter 253 may convert the DC power to a required voltage and may provide the converted power to the charger 254. The charger 254 may charge a battery (not shown). Although not shown, the converter 253 may provide the converted power to a power management integrated circuit (PMIC, not shown), and the PMIC (not shown) may provide power to various pieces of hardware of the electronic device 250.

The processor 255 may monitor the voltage of an output terminal of the rectifier 252. For example, the electronic device 250 may further include a voltmeter connected to the output terminal of the rectifier 252, and the processor 255 may receive a voltage value from the voltmeter and may monitor the voltage at the output terminal of the rectifier 252. The processor 255 may provide information including the voltage value of the output terminal of the rectifier 252 to the communication circuit 257. The charger, the converter, and the PMIC may be configured as different pieces of hardware, and at least two elements there among may be integrated into a single piece of hardware. The voltmeter may be configured as various types, such as an electrodynamic voltmeter, an electrostatic voltmeter, and a digital voltmeter, without being limited to a particular type. The communication circuit 257 may transmit a communication signal including reception power-related information using the communication antenna 258. The reception power-related information may be information associated with the level of received power, for example, the voltage of the output terminal of the rectifier 252, and may include the electric current of the output terminal of the rectifier 252. In this case, it would also be readily understood by those skilled in the art that an ammeter capable of measuring the current of the output terminal of the rectifier 252 may be further included in the electronic device 250. The ammeter may be configured as various types, such as a DC ammeter, an AC ammeter, and a digital ammeter, without being limited to a particular type. Further, reception power-related information may be measured at any point of the electronic device 250 in addition to the output terminal or an input terminal of the rectifier 252.

In addition, as described above, the processor 255 may transmit the communication signal 259 including the identification information about the electronic device 250. The memory 256 may store a program or algorithm capable of controlling various pieces of hardware of the electronic device 250.

Figure 3:
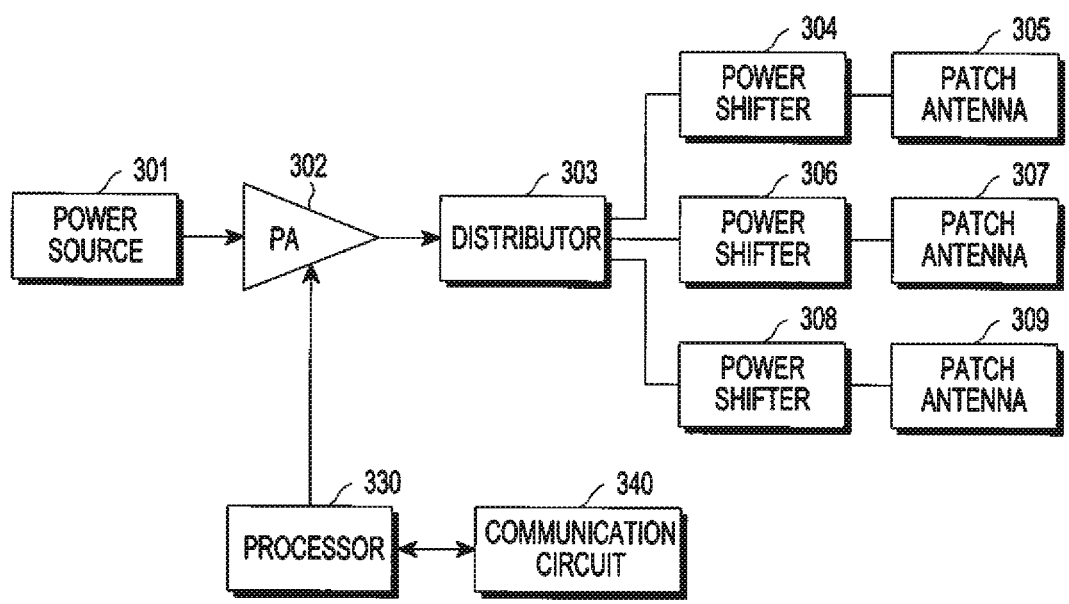
FIG. 3 is a block diagram illustrating a wireless power transmitter according to various embodiments of the disclosure.

FIG. 3 is a block diagram illustrating a wireless power transmitter according to various embodiments of the disclosure.

Referring to FIG. 3, a power source 301 may be connected to a power amplifier (PA) 302. The power amplifier 302 may amplify power provided from the power source, and an amplification gain may be controlled by a processor 330. For example, the processor 330 may determine the direction of an electronic device using a communication signal of the electronic device transmitted via a communication circuit 340. As described above, in order to determine the distance between the electronic device and the wireless power transmitter in the determined direction or to determine the level of power applied by each patch antenna which enables reception power-related information to satisfy a preset condition, the processor 330 may control the amplification gain of the power amplifier 302 so that a plurality of RF waves may be formed.

The power amplifier 302 may include an element, such as a GaN transistor. The power amplifier 302 may include a circuit capable of adjusting impedance at an input terminal of the GaN transistor. In addition, the power amplifier 302 may include a circuit capable of adjusting impedance at an output terminal of the GaN transistor. Accordingly, the power amplifier 302 may perform input-terminal impedance matching and output-terminal impedance matching for the GaN transistor, thus having relatively high efficiency or relatively high output. The power amplifier 302 according to various embodiments of the disclosure may perform impedance matching for a frequency of a fundamental component at the input terminal of the GaN transistor. The power amplifier 302 may perform impedance matching for a frequency of a harmonic component at the input terminal of the GaN transistor. The power amplifier 302 may adjust the frequency of the harmonic component without changing impedance for the frequency of the fundamental component. Further, the power amplifier 302 may adjust the frequency of the fundamental component without changing impedance for the frequency of the harmonic component. That is, the power amplifier 302 may independently adjust the impedance for the frequency of the harmonic component and the impedance for the frequency of the fundamental component. Accordingly, even though sensitivity by the harmonic component increases due to the amplification of a signal having a relatively high frequency, the impedance for the frequency of the fundamental component and the impedance for the frequency of the harmonic component can be independently adjusted, making it possible to adjust impedance to a desired impedance value. For example, the power amplifier 302 may include a circuit for impedance adjustment for the frequency of the fundamental component and a circuit for impedance adjustment for the frequency of the harmonic component which are connected to the input terminal of the GaN transistor. In addition, the power amplifier 302 may further include a frequency separation circuit that prevents impedance adjustment for the frequency of the fundamental component from affecting the impedance for the frequency of the harmonic component and prevents impedance adjustment for the frequency of the harmonic component from affecting the impedance for the frequency of the fundamental component. The power amplifier 302 may include a circuit for impedance adjustment for the frequency of the fundamental component and a circuit for impedance adjustment for the frequency of the harmonic component which are connected to the output terminal of the GaN transistor. In addition, the power amplifier 302 may further include a frequency separation circuit that prevents impedance adjustment for the frequency of the fundamental component from affecting the impedance for the frequency of the harmonic component and prevents impedance adjustment for the frequency of the harmonic component from affecting the impedance for the frequency of the fundamental component.

Power amplified by the power amplifier 302 may be provided to a distributor 303. The distributor 303 may distribute and provide power to a plurality of patch antennas 305, 307, and 309. Phase shifters 304, 306, and 308 may be disposed between the distributor 303 and the patch antennas 305, 307, and 309. The number of phase shifters and the number of patch antennas are provided for illustration, and different numbers of phase shifters and patch antennas are possible. As the phase shifters, a hardware element, such as HMC642 or HMC1113, may be used. The phase shifters 304, 306, and 308 may shift the phase of received AC power, and the shift level of each of the phase shifters 304, 306, and 308 may be controlled by the processor 330. The processor 330 may determine a shift level input to each of the phase shifters 304, 306, and 308 so that an RF wave is formed in the direction of the electronic device determined using a communication signal.

In various embodiments of the disclosure, the power amplifier 302 may be configured to be included in the distributor 303, to be included in each of the phase shifters 304, 306, and 308, or to be included in each of the patch antennas 305, 307, and 309.

Figure 4:
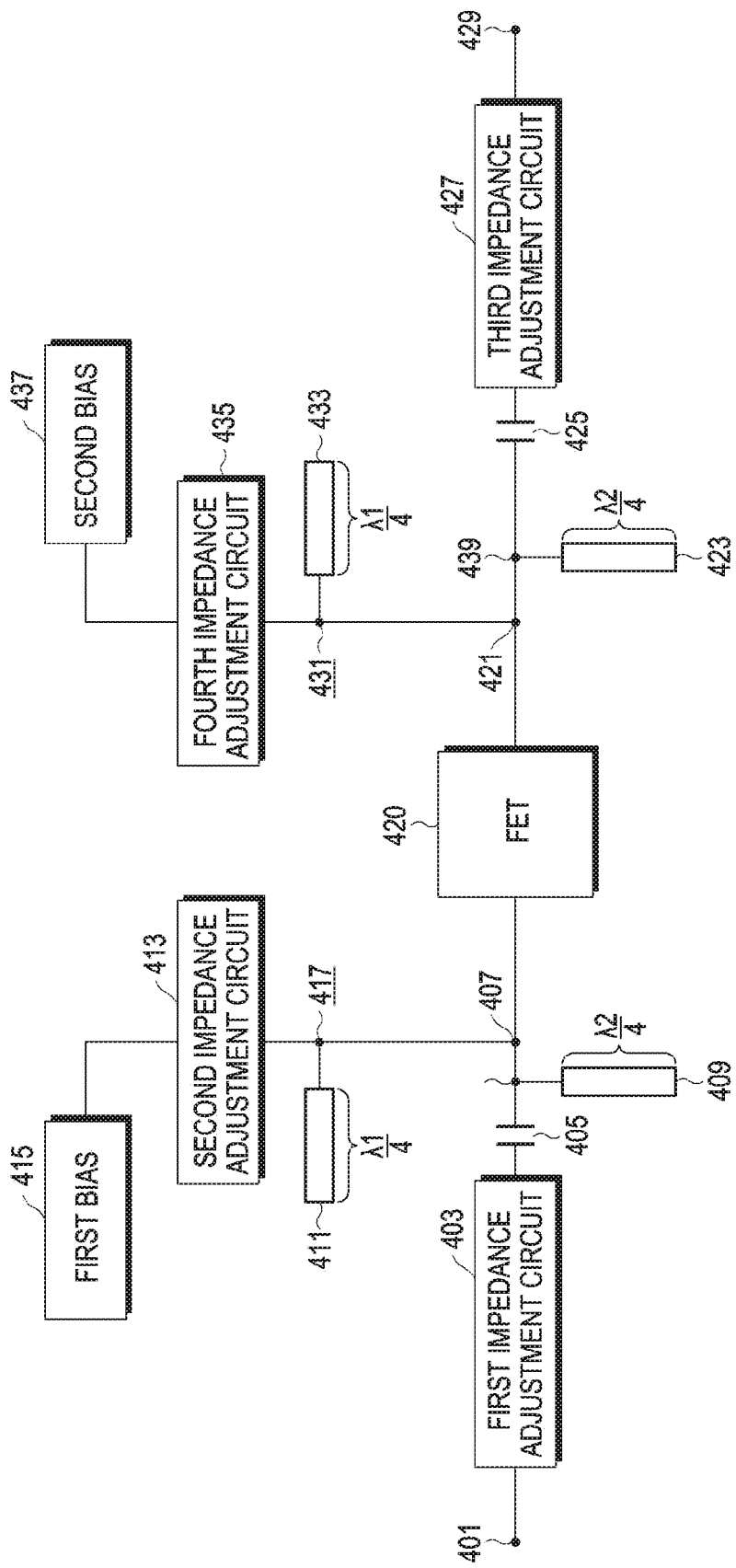
FIG. 4 is a conceptual diagram illustrating the configuration of a power amplifier according to various embodiments of the disclosure.

FIG. 4 is a conceptual diagram illustrating the configuration of a power amplifier according to various embodiments of the disclosure.

An input node 401 of the power amplifier may be connected, for example, to a power source (201 in FIG. 2) and may receive an electrical signal from the outside. A first impedance adjustment circuit 403 may be connected to the input node 401. The first impedance adjustment circuit 403 may adjust impedance for a frequency of a fundamental component at an input terminal of an FET 420. One end of a DC block capacitor 405 may be connected to the first impedance adjustment circuit 403. The DC block capacitor 405 may block a DC component from the electrical signal provided from the input node 401.

A first bias 415 may provide a preset first voltage to an input terminal 407 of the FET 420, and a second bias 437 may provide a preset second voltage to an output terminal 421 of the FET 420. For example, the second voltage may be greater than the first voltage, and thus an electrical signal input to the FET 420 may be amplified. The amplified electrical signal may be provided to an output node 429. The output node 429 may be connected, for example, to a phase shifter, and thus the amplified electrical signal may be provided to a power transmission antenna array. A second impedance adjustment circuit 413 may be connected to the first bias 415. The second impedance adjustment circuit 413 may adjust impedance for a frequency of a harmonic component at the input terminal 407 of the FET 420. The FET 420 may be replaced with a device capable of amplifying an input signal using a voltage supplied from a bias. Alternatively, the FET 420 may be replaced with another element having a nonlinear characteristic.

A node 419 may be connected to the other end of the DC block capacitor 405, and an open stub 409 may be connected to the node 419. For example, the open stub 409 may have a length of $\lambda_2/4$, and $\lambda_2$ may be a wavelength corresponding to the frequency of the harmonic component (e.g., 11.6 GHz, which is a multiplied harmonic frequency of the frequency of the fundamental component, 5.8 GHz). The second impedance adjustment circuit 413 may be connected to a node 417, and an open stub 411 may be connected to the node 417. For example, the open stub 411 may have a length of $\lambda_1/4$, and $\lambda_1$ may be a wavelength corresponding to the frequency of the fundamental component (e.g., 5.8 GHz). For the open stub 409, impedance for the frequency of the harmonic component, for example, the multiplied harmonic component, may be calculated and interpreted as a short circuit. Further, for the open stub 411, impedance for the fundamental component may be calculated and interpreted as a short circuit. Even though the first impedance adjustment circuit 403 adjusts the impedance for the frequency of the fundamental component, the impedance for the frequency of the harmonic component may not be changed by the first impedance adjustment circuit 403 due to the open stub 409. Further, even though the second impedance adjustment circuit 413 adjusts the impedance for the frequency of the harmonic component, the impedance for the frequency of the fundamental component may not be changed by the second impedance adjustment circuit 413 due to the open stub 411, which will be described in more detail later.

The output terminal 421 of the FET 420 may be connected to a node 439. An open stub 423 having a length of, for example, $\lambda_2/4$, may be connected to the node 439. The output terminal 421 of the FET 420 may be connected to a node 431. An open stub 433 having a length of, for example, $\lambda_1/4$, may be connected to the node 431. A fourth impedance adjustment circuit 435 may be connected to the node 431, and the second bias 437 may be connected to the fourth impedance adjustment circuit 435. The node 439 may be connected to one end of a DC block capacitor 425, and a third impedance adjustment circuit 427 may be connected to the other end of the DC block capacitor 425. The third impedance adjustment circuit 427 may adjust impedance for a frequency of a fundamental component at the output terminal 421 of the FET 420. The fourth impedance adjustment circuit 435 may adjust impedance for a frequency of a harmonic component, for example, a multiplied harmonic component, at the output terminal 421 of the FET 420. As described above, even though the third impedance adjustment circuit 427 changes the impedance for the frequency of the fundamental component, the impedance for the frequency of the harmonic component may not be changed by the third impedance adjustment circuit 427 due to the open stub 423. Further, even though the fourth impedance adjustment circuit 435 changes the impedance for the frequency of the harmonic component, for example, the multiplied harmonic component, the impedance for the frequency of the fundamental component may not be changed by the fourth impedance adjustment circuit 435 due to the open stub 433.

That is, the impedance for the fundamental component at the input terminal 407 of the FET 420 may be adjusted by an adjustment by the first impedance adjustment circuit 403. This may be because even though the second impedance adjustment circuit 413 performs an adjustment, the open stub 411 does not allow the impedance for the frequency of the fundamental component by the second impedance adjustment circuit 413 to affect a change of the impedance at the entire input terminal 407. The impedance for the harmonic component at the input terminal 407 of the FET 420 may be adjusted by an adjustment by the second impedance adjustment circuit 403. Due to the open stub 403, the impedance for the frequency of the harmonic component at the input terminal 407 may not be changed by an adjustment operation of the first impedance adjustment circuit 403. Accordingly, the power amplifier may adjust the impedance for the frequency of the fundamental component at the input terminal 407 to a desired value using the first impedance adjustment circuit 403 and may adjust the impedance for the frequency of the harmonic component at the input terminal 407 to a desired value using the second impedance adjustment circuit 413.

Further, the impedance for the fundamental component at the output terminal 421 of the FET 420 may be adjusted by an adjustment by the third impedance adjustment circuit 427. This may be because even though the fourth impedance adjustment circuit 435 performs an adjustment, the open stub 431 does not allow the impedance for the frequency of the fundamental component by the fourth impedance adjustment circuit 435 to affect a change of the impedance at the entire output terminal 421. The impedance for the harmonic component at the output terminal 421 of the FET 420 may be adjusted by an adjustment by the fourth impedance adjustment circuit 435. Due to the open stub 423, the impedance for the frequency of the harmonic component at the output terminal 421 may not be changed by an adjustment operation of the third impedance adjustment circuit 427. Accordingly, the power amplifier may adjust the impedance for the frequency of the fundamental component at the output terminal 421 to a desired value using the third impedance adjustment circuit 427 and may adjust the impedance for the frequency of the harmonic component at the output terminal 421 to a desired value using the fourth impedance adjustment circuit 435. It would be easily understood by those skilled in the art that there is no limitation on the type of the first impedance adjustment circuit 403, the second impedance adjustment circuit 413, the third impedance adjustment circuit 427, and the fourth impedance adjustment circuit 435 as long as a circuit capable of changing impedance is used. As described above, it is possible adjust impedance to the optimal point of impedance for the frequency of the fundamental component at the input terminal, to the optimal point of impedance for the frequency of the harmonic component at the input terminal, to the optimal point of impedance for the frequency of the fundamental component at the output terminal, and to the optimal point of impedance for the frequency of the harmonic component at the output terminal.

Figure 5:
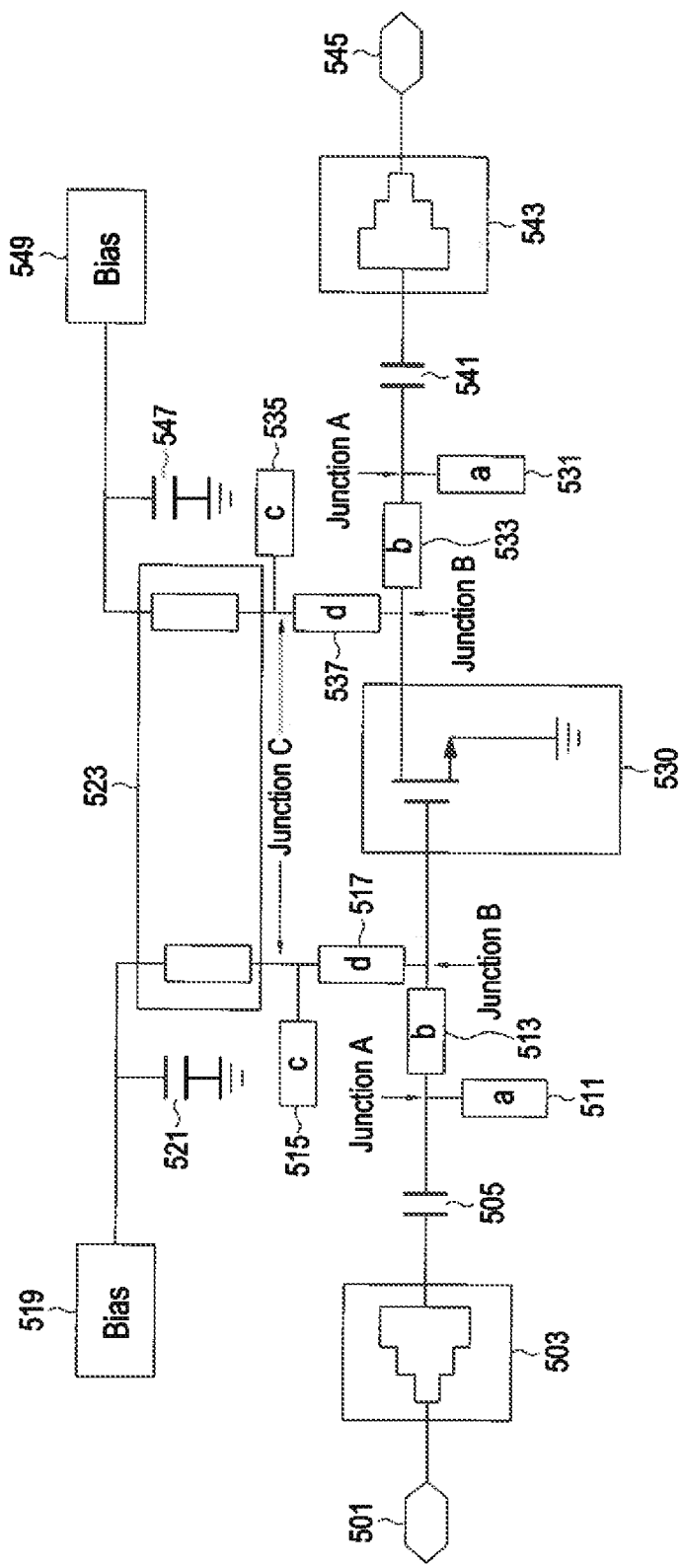
FIG. 5 is a conceptual diagram illustrating the configuration of a power amplifier according to various embodiments of the disclosure.
Figure 6A:
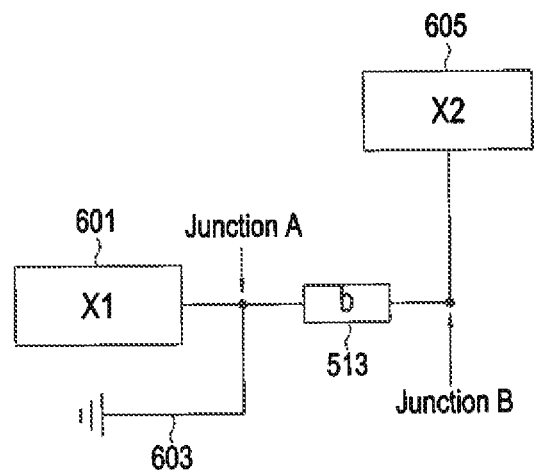
FIG. 6A is a conceptual diagram illustrating simplified impedance for a frequency of a multiplied harmonic component.
Figure 6B:
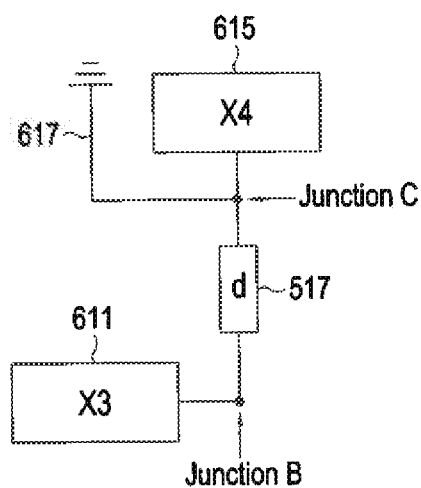
FIG. 6B is a conceptual diagram illustrating simplified impedance for a frequency of a fundamental component.

FIG. 5 is a conceptual diagram illustrating the configuration of a power amplifier according to various embodiments of the disclosure. The embodiment of FIG. 5 will be described in more detail with reference to FIG. 6A and FIG. 6B. FIG. 6A is a conceptual diagram illustrating simplified impedance for a frequency of a multiplied harmonic component, and FIG. 6B is a conceptual diagram illustrating simplified impedance for a frequency of a fundamental component.

An input node 501 may be connected to a first impedance adjustment circuit 503, and the first impedance adjustment circuit 503 may be connected to one end of a DC block capacitor 505. An a open stub 511 and a b transmission line 513 may be connected to the other end of the DC block capacitor 505. The a open stub 511 may be a transmission line having a phase of 90 degrees with respect to a frequency of a harmonic component, for example, a multiplied harmonic component, and may be disposed substantially perpendicular to the extension direction of the b transmission line 513 continuing from the DC block capacitor 505. The b transmission line 513 may be a transmission line having a phase of 90 degrees with respect to the frequency of the harmonic component, for example, the multiplied harmonic component. For example, the a open stub 511 and the b transmission line 513 may have a length of $\lambda_2/4$. When interpreted as impedance for the frequency of the multiplied harmonic component, the a open stub 511 may be interpreted as a short circuit, and the b transmission line 513 may be interpreted as open. That is, impedance for the frequency of the multiplied harmonic component of the a open stub 511 at junction A may be theoretically zero, and impedance for the frequency of the multiplied harmonic component of the b transmission line 513 at junction A may be theoretically infinite. For example, impedance for the frequency of the multiplied harmonic component may be interpreted as simplified in FIG. 6A. Since the a open stub 511 may be interpreted as a short circuit as impedance for the frequency of the multiplied harmonic component in FIG. 5, the a open stub 511 may be interpreted as a short-circuited line 603 as in FIG. 6A. In addition, total impedance for the first impedance adjustment circuit 503 and the DC block capacitor 505 in FIG. 5 may be simplified as X1 impedance 601. Even though the first impedance adjustment circuit 503 performs an adjustment operation to adjust impedance for a frequency of a fundamental component, the X1 impedance 601 is connected with the short-circuited line 603 at junction A, and thus the impedance for the frequency of the multiplied harmonic component by the first impedance adjustment circuit 503 may not affect, for example, impedance for the frequency of the multiplied harmonic component at an input terminal of a GaN transistor 530. In addition, since the b transmission line 513 may be interpreted as open for the frequency of the multiplied harmonic component, the impact of the impedance for the frequency of the multiplied harmonic component by the first impedance adjustment circuit 503 may be disregarded. That is, it may be interpreted that junction B is connected to X2 impedance 605, and thus a change of impedance for the frequency of the multiplied harmonic component occurring in a direction from junction A to the DC block capacitor 505 may also be disregarded. The X2 impedance 605 may be simplified total impedance for a c open stub 515, a d transmission line 517, a transmission line 523 for impedance change, and an RF short capacitor 521. For example, the power amplifier may adjust the length of at least a portion of the transmission line 523 for impedance change, for example, a left transmission line of the transmission line 523 for impedance change, and thus the impedance for the frequency of the multiplied harmonic component may be changed. The RF short capacitor 521 may have, for example, a self-resonant frequency (SRF) of the frequency (e.g., 11.6 GHz) of the multiplied harmonic component.

The c open stub 515 may be a transmission line having a phase of 90 degrees with respect to a frequency of a fundamental component. The d transmission line 517 may be a transmission line having a phase of 90 degrees with respect to the frequency of the fundamental component. For example, the c open stub 515 and the d transmission line 517 may have a length of $\lambda_1/4$. When interpreted as impedance for the frequency of the fundamental component, the c open stub 515 may be interpreted as a short circuit, and the d transmission line 517 may be interpreted as open. That is, impedance for the frequency of the fundamental component of the c open stub 515 at junction C may be theoretically zero, and impedance for the frequency of the fundamental component of the d transmission line 517 at junction B may be theoretically infinite. For example, impedance for the frequency of the fundamental component may be interpreted as simplified in FIG. 6B. Since the c open stub 515 may be interpreted as a short circuit as impedance for the frequency of the fundamental component in FIG. 5, the c open stub 515 may be interpreted as a short-circuited line 617 as in FIG. 6B. In addition, total impedance for the RF short capacitor 521 and at least a portion of the transmission line 523 for impedance change in FIG. 5 may be simplified as X4 impedance 615 in FIG. 6B. Even though the length of at least a portion of the transmission line 523 for impedance change, for example, a left transmission line of the transmission line 523 for impedance change, is adjusted, X4 impedance 615 is connected with a short-circuited line 617 at junction C, and thus the impedance for the frequency of the fundamental component by at least the portion of the transmission line 523 for impedance change may not affect, for example, impedance for the frequency of the fundamental component at an input terminal of a GaN transistor 530. Furthermore, since the d transmission line 517 may be interpreted as open for the frequency of the fundamental component, the impact of the impedance for the frequency of the fundamental component by at least the portion of the transmission line 523 for impedance change may be disregarded. That is, it may be interpreted that junction B is connected to X3 impedance 611, and thus a change of impedance for the frequency of the fundamental component occurring in a direction from junction B to the transmission line 523 for impedance change may also be disregarded. The X3 impedance may be simplified total impedance for the first impedance adjustment circuit 503, the DC block capacitor 505, the a open stub 511, and the b transmission line 513.

As described above, by the first impedance adjustment circuit 503 performing an adjustment, it is possible to adjust the impedance for the frequency of the fundamental component at the input terminal of the GaN transistor 530 without affecting the impedance for the frequency of the multiplied harmonic component. Further, by adjusting the length of at least a portion of the transmission line 523 for impedance change, for example, a left transmission line of the transmission line 523 for impedance change, it is possible to adjust the impedance for the frequency of the multiplied harmonic component at the input terminal of the GaN transistor 530 without affecting the impedance for the frequency of the fundamental component. The a open stub 511, the b transmission line 513, the c open stub 515, and the d transmission line 517 may collectively be referred to as a frequency separation circuit. Further, an a open stub 531, a b transmission line 533, a c open stub 535, and a d transmission line 537 may collectively be referred to as a frequency separation circuit.

Impedance for the frequency of the fundamental component and impedance for the frequency of the multiplied harmonic component may be independently adjusted at an output terminal of the GaN transistor 530 in the same manner as described above. The b transmission line 533 and the d transmission line 537 may be connected to the output terminal of the GaN transistor 530. The b transmission line 533 may be connected to the a open stub 531. The a open stub 531 and the b transmission line 533 may have substantially the same length, $\lambda_2/4$, as the a open stub 511 and the b transmission line 513. The d transmission line 537 may be connected to the c open stub 535. The c open stub 535 and the d transmission line 537 have substantially the same length, $\lambda_1/4$ as the c open stub 515 and the d transmission line 517. One end of a DC block capacitor 541 may be connected to junction A, and a third impedance adjustment circuit 543 may be connected to the other end of the DC block capacitor 541. The third impedance adjustment circuit 543 may be connected to an output node 545. The GaN transistor 530 may amplify and output an input electrical signal using a voltage output from a first bias 519 and a second bias 549. The transmission line 523 for impedance change may be connected to the d transmission line 537 and the c open stub 535, and an RF short capacitor 547 may be connected to the transmission line 523 for impedance change. The RF short capacitor 547 may have, for example, the SRF of the frequency of the multiplied harmonic component. That is, the circuit configuration of the output terminal of the GaN transistor 530 may be the reversed form of the circuit configuration of the input terminal of the GaN transistor 530. Thus, by the third impedance adjustment circuit 543 performing an adjustment, it is possible to adjust the impedance for the frequency of the fundamental component at the output terminal of the GaN transistor 530 without affecting the impedance for the frequency of the multiplied harmonic component. Further, by adjusting the length of at least a portion of the transmission line 523 for impedance change, for example, a right transmission line of the transmission line 523 for impedance change, it is possible to adjust the impedance for the frequency of the multiplied harmonic component at the output terminal of the GaN transistor 530 without affecting the impedance for the frequency of the fundamental component.

As described above, it is possible to independently adjust the impedance for the frequency of the fundamental component and the impedance for the frequency of the multiplied harmonic component at the input terminal or the output terminal of the GaN transistor 530, and it is possible to adjust impedance to an optimal impedance value suitable for maximum efficiency or maximum output depending on the configuration, thereby achieving an efficiency of 70% or higher or an output of 50 W or more with a single transistor in a band of 5.8 GHz or above.

Figure 7:
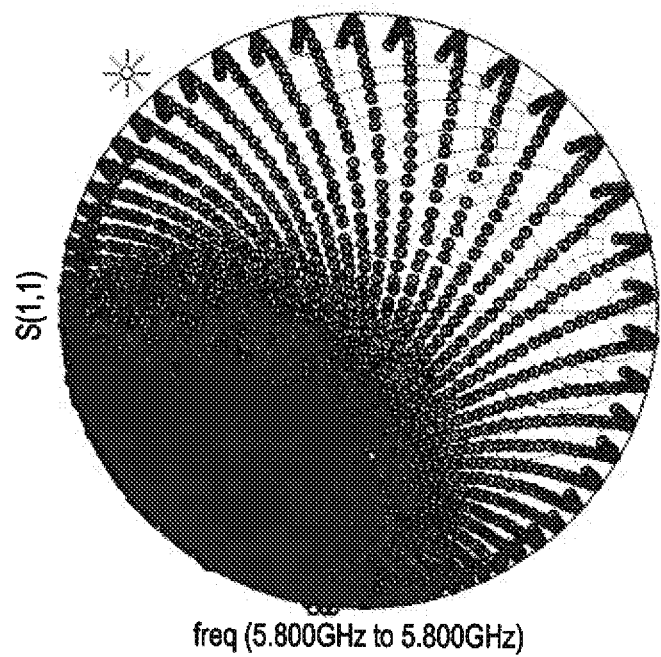
FIG. 7 illustrates a simulation result of a power amplifier.
Figure 8:
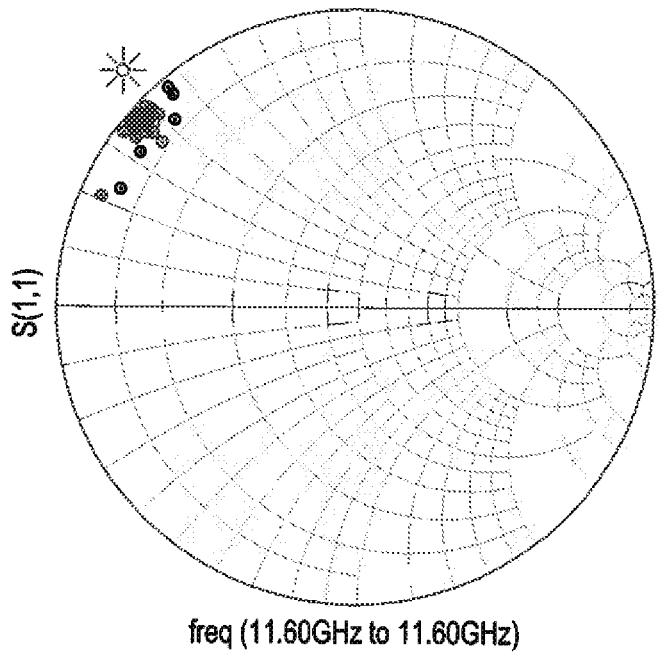
FIG. 8 illustrates a simulation result of a power amplifier.

FIG. 7 illustrates a simulation result of a power amplifier. FIG. 8 illustrates a simulation result of a power amplifier. FIG. 7 illustrates an impedance change according to the full sweep of impedance for a frequency of a fundamental component after a DC block capacitor. A CGH40035F device, a packaged device by Cree, was used for the design. It is identified that the impedance for the frequency of the fundamental component can move the entire range of the Smith chart. FIG. 8 illustrates an impedance change with respect to a frequency of a multiplied harmonic component according to a change of a matching circuit after a DC block capacitor.

FIG. 7 shows that the impedance for the frequency of the fundamental component sweeps the entire range of the Smith chart, while FIG. 8 shows that the impedance for the frequency of the multiplied harmonic component is concentrated on a particular point and does not cause any significant change. That is, it is identified that the impedance for the frequency of the fundamental component and the impedance for the frequency of the multiplied harmonic component can be independently adjusted.

Figure 9:
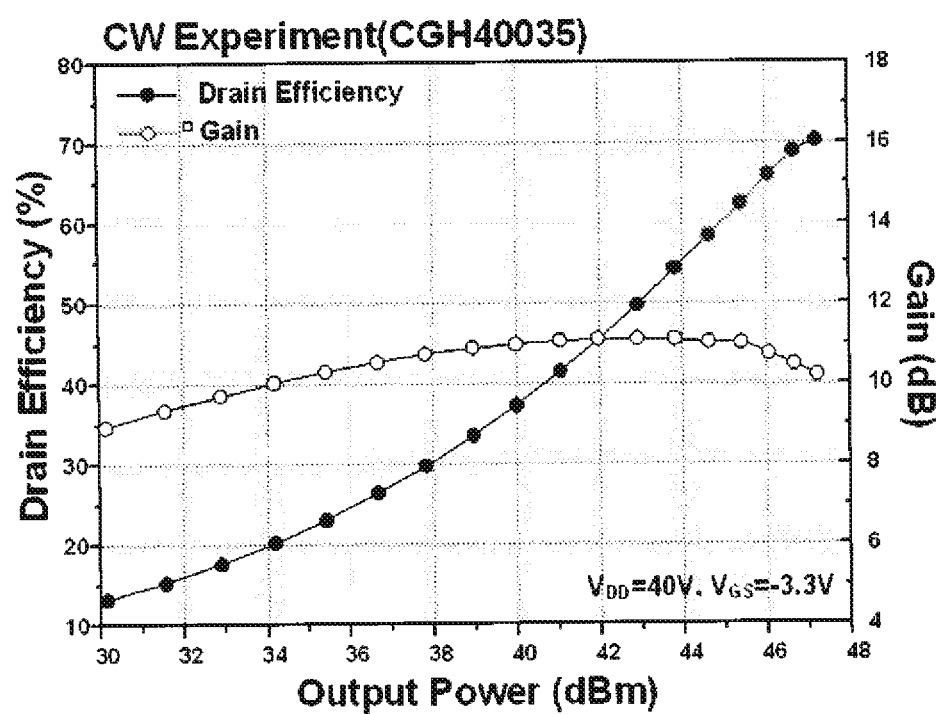
FIG. 9 illustrates the performance of a power amplifier having an operating frequency of 5.8 GHz according to various embodiments of the disclosure.

FIG. 9 illustrates the performance of a power amplifier having an operating frequency of 5.8 GHz according to various embodiments of the disclosure. It is identified that a relatively high efficiency of 70.2% and a relatively high output of 47.2 dBm can be achieved even though a relatively high operating frequency of 5.8 GHz is used, which means that impedance for a frequency of a fundamental component and impedance for a frequency of a multiplied harmonic component can be matched and that overall efficiency is also increased.

Figure 10A:
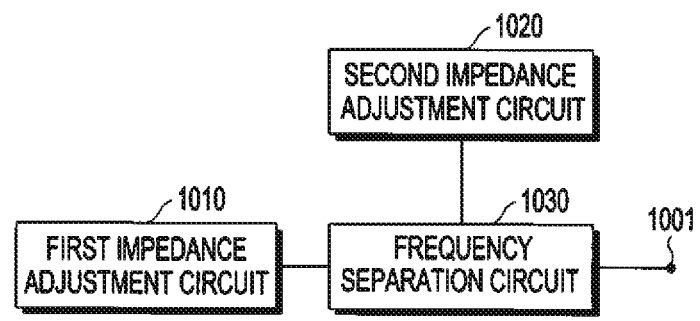
FIG. 10A illustrates an impedance adjustment circuit for a plurality of frequencies according to various embodiments of the disclosure.
Figure 10B:
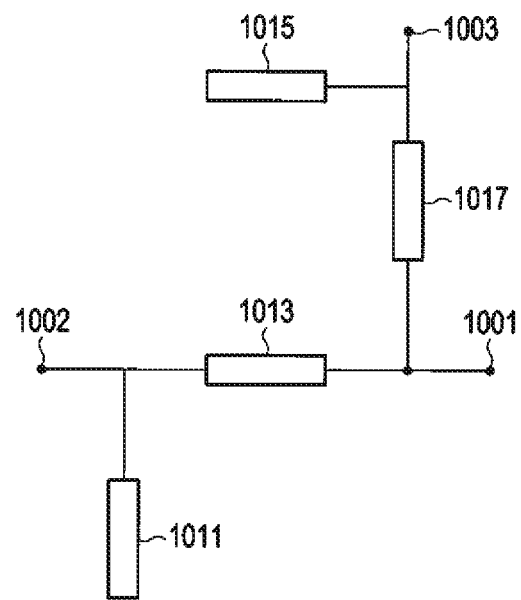
FIG. 10B illustrates an impedance adjustment circuit for a plurality of frequencies according to various embodiments of the disclosure.

FIG. 10A illustrates an impedance adjustment circuit for a plurality of frequencies according to various embodiments of the disclosure. FIG. 10B illustrates an impedance adjustment circuit for a plurality of frequencies according to various embodiments of the disclosure.

An impedance adjustment circuit may include a connection node 1001, and the connection node 1001 may be connected to any device which requires impedance matching. A frequency separation circuit 1030 may be connected to the connection node 1001, and a first impedance adjustment circuit 1010 and a second impedance adjustment circuit 1020 may be connected to the frequency separation circuit 1030. The first impedance adjustment circuit 1010 may adjust impedance for a first frequency, and the second impedance adjustment circuit 1020 may adjust impedance for a second frequency. The frequency separation circuit 1030 may prevent the impact of the first impedance adjustment circuit 1010 on the impedance for the second frequency during an adjustment operation of the first impedance adjustment circuit 1010. The frequency separation circuit 1030 may prevent the impact of the second impedance adjustment circuit 1020 on the impedance for the first frequency during an adjustment operation of the second impedance adjustment circuit 1020. For example, as illustrated in FIG. 10B, the frequency separation circuit 1030 may include transmission lines 1013 and 1017 and open stubs 1011 and 1015. A node 1002 may be connected to the first impedance adjustment circuit 1010, and a node 1003 may be connected to the second impedance adjustment circuit 1020. The open stub 1011 and the transmission line 1013 may be designed to have a phase of 90 degrees with respect to the second frequency. For example, the open stub 1011 and the transmission line 1013 may have a length of a second wavelength corresponding to the second frequency divided by 4. The open stub 1015 and the transmission line 1017 may be designed to have a phase of 90 degrees with respect to the first frequency. For example, the open stub 1015 and the transmission line 1017 may have a length of a first wavelength corresponding to the first frequency divided by 4. As described above, impedance adjustment for the first frequency by the first impedance adjustment circuit 1010 and impedance adjustment for the second frequency by the second impedance adjustment circuit 1020 may be independently performed. The second frequency may not be a harmonic wave of the first frequency, and the first frequency and the second frequency may be arbitrarily selected.

Various embodiments disclosed herein are provided merely to easily describe technical details of the disclosure and to help the understanding of the disclosure, and are not intended to limit the scope of the disclosure. Therefore, it should be construed that all modifications and changes or modified and changed forms based on the technical idea of the disclosure fall within the scope of the disclosure.

The invention claimed is:

1. A power amplifier comprising:
an element configured to amplify an electrical signal received through an input terminal and to output the amplified electrical signal through an output terminal;
a first impedance adjustment circuit connected to the input terminal of the element and configured to adjust impedance for a frequency of a fundamental component at the input terminal;
a second impedance adjustment circuit connected to the input terminal of the element and configured to adjust impedance for a frequency of a multiplied harmonic component at the input terminal;
a third impedance adjustment circuit connected to the output terminal of the element and configured to adjust impedance for the frequency of the fundamental component at the output terminal;
a fourth impedance adjustment circuit connected to the output terminal of the element and configured to adjust impedance for the frequency of the multiplied harmonic component at the output terminal;
a first frequency separation circuit configured to prevent a change of the impedance for the frequency of the multiplied harmonic component at the input terminal by the first impedance adjustment circuit and to prevent a change of the impedance for the frequency of the fundamental component at the input terminal by the second impedance adjustment circuit; and
a second frequency separation circuit configured to prevent a change of the impedance for the frequency of the multiplied harmonic component at the output terminal by the third impedance adjustment circuit and to prevent a change of the impedance for the frequency of the fundamental component at the output terminal by the fourth impedance adjustment circuit.

2. The power amplifier of claim 1, wherein the first frequency separation circuit comprises:
a first transmission line connected to the input terminal of the element and the first impedance adjustment circuit; and
a first open stub connected to the first transmission line and the first impedance adjustment circuit.

3. The power amplifier of claim 2, wherein the first transmission line and the first open stub have a length of a wavelength corresponding to the frequency of the multiplied harmonic component divided by 4.

4. The power amplifier of claim 1, wherein the first frequency separation circuit comprises:

a second transmission line connected to the input terminal of the element and the second impedance adjustment circuit; and a second open stub connected to the second transmission line and the second impedance adjustment circuit.

5. The power amplifier of claim 4, wherein the second transmission line and the second open stub have a length of a wavelength corresponding to the frequency of the fundamental component divided by 4.

6. The power amplifier of claim 4, wherein the second impedance adjustment circuit comprises:

a first RF short capacitor connected to a first bias that applies a first voltage to the element and having a self-resonant frequency (SRF) of the frequency of the multiplied harmonic component; and a first impedance adjustment transmission line configured to adjust the impedance for the frequency of the multiplied harmonic component at the input terminal by adjusting a distance between the first RF short capacitor and the second open stub.

7. The power amplifier of claim 1, wherein the second frequency separation circuit comprises:

a third transmission line connected to the output terminal of the element and the third impedance adjustment circuit; and a third open stub configured to be connected to the third transmission line and the third impedance adjustment circuit.

8. The power amplifier of claim 7, wherein the third transmission line and the third open stub have a length of a wavelength corresponding to the frequency of the multiplied harmonic component divided by 4.

9. The power amplifier of claim 1, wherein the second frequency separation circuit comprises:

a fourth transmission line connected to the output terminal of the element and the fourth impedance adjustment circuit; and a fourth open stub connected to the fourth transmission line and the fourth impedance adjustment circuit.

10. The power amplifier of claim 9, wherein the fourth transmission line and the fourth open stub have a length of a wavelength corresponding to the frequency of the fundamental component divided by 4.

11. The power amplifier of claim 9, wherein the second impedance adjustment circuit comprises:

a second RF short capacitor connected to a second bias that applies a second voltage to the element and having a self-resonant frequency (SRF) of the frequency of the multiplied harmonic component; and a second impedance adjustment transmission line configured to adjust the impedance for the frequency of the multiplied harmonic component at the output terminal by adjusting a distance between the second RF short capacitor and the fourth open stub.

12. The power amplifier of claim 1, further comprising:

a first DC block capacity connected to the first frequency separation circuit and the first impedance adjustment circuit; and a second DC block capacity connected to the second frequency separation circuit and the third impedance circuit.

* * * * *